US012672322B2

(12) United States Patent
Pandey et al.

(10) Patent No.: US 12,672,322 B2
(45) Date of Patent: Jun. 30, 2026

(54) SEMICONDUCTOR DEVICE INCLUDING POROUS SEMICONDUCTOR MATERIAL ADJACENT AN ISOLATION STRUCTURE

(71) Applicant: GlobalFoundries U.S. Inc., Malta, NY (US)

(72) Inventors: Shesh Mani Pandey, Saratoga Springs, NY (US); Rajendran Krishnasamy, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 463 days.

(21) Appl. No.: 18/157,939

(22) Filed: Jan. 23, 2023

(65) Prior Publication Data

US 2024/0250120 A1     Jul. 25, 2024

(51) Int. Cl.
*H10D 62/10*     (2025.01)
*H10D 30/01*     (2025.01)
(Continued)

(52) U.S. Cl.
CPC ....... *H10D 62/113* (2025.01); *H10D 30/0281* (2025.01); *H10D 30/65* (2025.01);
(Continued)

(58) Field of Classification Search
CPC .. H10D 62/113; H10D 30/0281; H10D 30/65; H10D 30/601; H10D 30/603;
(Continued)

(56) References Cited

U.S. PATENT DOCUMENTS

| 5,635,419 A | * | 6/1997 | Geiss | ..................... H10D 1/665 |
| | | | | 257/E21.651 |
| 6,617,656 B2 | * | 9/2003 | Lee | ..................... H10D 62/111 |
| | | | | 257/E29.268 |

(Continued)

OTHER PUBLICATIONS

U.S. Appl. No. 18/171,765, filed Feb. 21, 2023, 47 pages.
(Continued)

*Primary Examiner* — William B Partridge
*Assistant Examiner* — Erik A. Anderson
(74) *Attorney, Agent, or Firm* — Francois Pagette; Hoffman Warnick LLC

(57)     ABSTRACT

Disclosed are embodiments of a semiconductor structure including a semiconductor device with an active device region and, within the active device region, porous semiconductor material adjacent to an isolation structure. In some embodiments, the semiconductor device can be a laterally diffused metal oxide semiconductor field effect transistor (LDMOSFET). The LDMOSFET can include an active device region, a well region within the active device region and, within the well region, an isolation structure, a porous region immediately adjacent to the isolation structure, and a drain drift region that borders the isolation structure (e.g., between a channel region and a drain region). The porous region can modify the electric field in the drain drift region around the isolation structure and, as a result, can improve both drain-to-source breakdown voltage (BVdss) and transconductance (Gm) of the device. Also disclosed are method embodiments for forming the semiconductor structure.

20 Claims, 6 Drawing Sheets

(51) Int. Cl.

| | | |
|---|---|---|
| *H10D 30/60* | (2025.01) | |
| *H10D 30/65* | (2025.01) | |
| *H10P 14/60* | (2026.01) | |
| *H10P 50/28* | (2026.01) | |

(52) U.S. Cl.
CPC .......... *H10P 14/665* (2026.01); *H10P 50/283* (2026.01); *H10D 30/601* (2025.01)

(58) Field of Classification Search
CPC ............. H10D 30/0221; H10D 62/307; H10D 62/116; H10D 62/151; H10D 62/117; H01L 21/02203; H01L 21/31111; H10P 14/665; H10P 50/283
See application file for complete search history.

(56) References Cited

U.S. PATENT DOCUMENTS

| | | | | |
|---|---|---|---|---|
| 7,550,803 | B1 | 6/2009 | Huang | |
| 8,716,791 | B1 * | 5/2014 | Iravani | H10D 30/65 |
| | | | | 257/397 |
| 8,816,465 | B1 | 8/2014 | Gardner et al. | |
| 9,153,666 | B1 | 10/2015 | Iravani et al. | |
| 9,450,074 | B1 | 9/2016 | Yang et al. | |
| 9,461,046 | B1 | 10/2016 | Edwards et al. | |
| 9,905,687 | B1 | 2/2018 | Zhu et al. | |
| 10,290,712 | B1 | 5/2019 | Ciavatti et al. | |
| 2004/0173859 | A1 | 9/2004 | Hao et al. | |
| 2005/0215011 | A1 | 9/2005 | Darwish et al. | |
| 2006/0128085 | A1 | 6/2006 | Shibib et al. | |
| 2008/0246055 | A1 * | 10/2008 | Schulze | H10D 30/66 |
| | | | | 257/E29.328 |
| 2009/0127626 | A1 | 5/2009 | Zhu et al. | |
| 2009/0140335 | A1 | 6/2009 | Schneider et al. | |
| 2009/0256200 | A1 | 10/2009 | Yao et al. | |
| 2011/0284953 | A1 | 11/2011 | Long et al. | |
| 2013/0248852 | A1 | 9/2013 | Yokozeki | |
| 2014/0001545 | A1 | 1/2014 | Yang et al. | |
| 2015/0171147 | A1 | 6/2015 | You | |
| 2016/0093647 | A1 | 3/2016 | Kim et al. | |
| 2017/0352756 | A1 | 12/2017 | Lin et al. | |
| 2017/0372985 | A1 | 12/2017 | Birner et al. | |
| 2017/0373187 | A1 | 12/2017 | Birner et al. | |
| 2018/0061982 | A1 * | 3/2018 | Sambi | H10D 62/53 |
| 2018/0350995 | A1 | 12/2018 | Kim et al. | |
| 2020/0212076 | A1 | 7/2020 | Jang et al. | |
| 2020/0235200 | A1 | 7/2020 | Obata et al. | |
| 2021/0072304 | A1 | 3/2021 | Coyne et al. | |
| 2021/0119041 | A1 | 4/2021 | Ma | |
| 2021/0184033 | A1 | 6/2021 | Coyne et al. | |
| 2021/0296513 | A1 | 9/2021 | Sano et al. | |
| 2022/0052197 | A1 | 2/2022 | Wada | |
| 2022/0059525 | A1 | 2/2022 | Mahajan et al. | |
| 2022/0069081 | A1 | 3/2022 | Lin et al. | |

OTHER PUBLICATIONS

Asif et al., "Ultra-thin flexible 100 V Chipfilm™ N-LDMOS," in Sep. 2011 IEEE Proceedings of the European Solid-State Device Research Conference (ESSDERC), pp. 215-218.

Barkhordarian, "Power MOSEFET Basics," International Rectifier, retrieved from: https://www.infineon.com on Dec. 15, 2022, 13 pages.

Gautier et al., "Porous silicon for electrical isolation in radio frequency devices: A review," Applied Physics Reviews 1, 011101, published online Jan. 2, 2014, 19 pages.

Huang et al., "0.18um BCD Technology with Best-in-Class LDMOS from 6 V to 45 V," Proceedings of the 26th International Symposium on Power Semiconductor Devices & IC's, Jun. 15-19, 2014, pp. 179-181.

Sailor, "Porous Silicon in Practice: Preparation, Characterization and Applications," First Edition, Published 2012, 42 pages.

Starostina et al., "Porous-Silicon Formation in HF-HNO3-H2O Etchants," Russian Microelectronics, vol. 31, No. 2, 2002, pp. 88-96.

Bon et al., "RF Power NLDMOS Technology Transfer Strategy from the 130nm to the 65nm on thin SOI," 2007 IEEE International SOI Conference Proceedings, pp. 61-62.

Fiorenza et al., "A Rf Power LDMOS Device on SOI," Oct. 1999 IEEE International SOI Conference, pp. 96-97.

Fiorenza et al., "RF Power LDMOSFET on SOI," IEEE Electron Device Letters, vol. 22, No. 3, Mar. 2001, pp. 139-141.

Luo et al., "Ultralow ON-Resistance SOI LDMOS With Three Separated Gates and High-K Dielectric," IEEE Transactions on Electron Devices, vol. 63, No. 9, Sep. 2016, pp. 3804-3807.

Mai et al., "Cost-Effective Integration of RF-LDMOS Transistors in 0.13 µm CMOS Technology," Jan. 2009, IEEE Topical Meeting on Silicon Monolithic Integrated Circuits in RF Systems, 4 pages.

Toh et al., "RF Performance of a Highly Linear Power Amplifier EDNMOS Transistor on Trap-Rich SOI," IEEE Electron Device Letters, vol. 39, No. 9, Sep. 2018, pp. 1346-1349.

Xu et al., "Multi-Gates SOI LDMOS for Improved on-state Performance," Proceedings of the 26th International Symposium on Power Semiconductor Devices and IC's, Jun. 15-19, 2014, pp. 175-178.

European Search Report for EP Application No. 23204516.1-1211 dated May 15, 2024, 9 pages.

1 European Search Report for corresponding EP Application No. 2319844.1-1212 dated Feb. 13, 2024, 9 pages.

U.S. Appl. No. 18/171,765, Office Action dated Nov. 5, 2025, 12 pages.

U.S. Appl. No. 18/171,765, Amendment to Office Action filed Jan. 14, 2026, 14 pages.

U.S. Appl. No. 18/171,765, Final Office Action dated Mar. 25, 2026, 14 pages.

U.S. Appl. No. 18/171,765, Advisory Action dated Apr. 29, 2026, 3 pages.

U.S. Appl. No. 18/171,765, Amendment to Final Office Action filed Apr. 23, 2026, 16 pages.

U.S. Appl. No. 18/171,765, Notice of Allowance dated May 26, 2026, 9 pages.

* cited by examiner

SEMICONDUCTOR DEVICE INCLUDING POROUS SEMICONDUCTOR MATERIAL ADJACENT AN ISOLATION STRUCTURE

BACKGROUND

The present disclosure relates to semiconductor structures and, more particularly, to embodiments of a semiconductor structure including a semiconductor device and to embodiments of a method of forming the semiconductor structure.

Factors considered in modern integrated circuit (IC) design include, but are not limited to, performance improvement, size scaling, and power consumption. Oftentimes, however, there is a tradeoff between these factors. For example, laterally diffused metal oxide semiconductor field effect transistors (LDMOSFETs) are widely used in amplifiers, such as radio-frequency (RF) amplifiers, microwave power amplifiers, etc. because of their low on-resistance and because, in general, they have a relatively high blocking voltage (also referred to in the art as the drain-to-source breakdown voltage (BVdss)). However, with device size scaling and operation at higher voltages, LDMOSFETs can exhibit performance degradation including, but not limited to, reduced BVdss and reduced transconductance (Gm). BVdss refers to the specific drain-to-source voltage (Vds) that results in the transistor entering the breakdown region at which Vds is too high and the drain current (Id) spikes (i.e., increases dramatically). Gm refers to the ratio of the change in Id to the change in gate voltage (Vg) (i.e., Id2–Id1/Vg2–Vg1) over, for example, some period of time in the I/V curve for the device.

SUMMARY

Disclosed herein are embodiments of a structure. The structure can include a semiconductor layer and a device. The device can include at least a first well region in the semiconductor layer, a porous region in the first well region, and an isolation structure in the first well region. In this structure, the porous region can specifically be positioned immediately adjacent to at least one side of the isolation structure.

Some embodiments of the structure disclosed herein can include a semiconductor layer and a device. The device can include a first well region in the semiconductor layer, a porous region in the first well region, and an isolation structure in the first well region. Again, the porous region can be positioned immediately adjacent to at least one side of the isolation structure. The device can further include a drain region immediately adjacent to the first well region. The device can further include a second well region in the semiconductor layer positioned laterally adjacent to the first well region. The porous region and the isolation structure can specifically be within the first well region between the second well region and the drain region. The device can further include a source region immediately adjacent to the second well region. The device can further include a gate on the semiconductor layer between the drain region and the source region. This gate can specifically be separated from the drain region by a first distance and from the source region by a second distance that is less than the first distance. The device can further include a drain drift region in the first well region bordering the isolation structure such that it is between the drain region and the gate.

Also disclosed herein are method embodiments for forming the above-described structures. The method can include providing a semiconductor layer. The method can further include forming a device that includes a first well region in the semiconductor layer and, in the first well region, a porous region and an isolation structure. The porous region and the isolation structure can specifically be formed in the first well region such that the porous region is positioned immediately adjacent to at least one side of the isolation structure.

BRIEF DESCRIPTION OF THE DRAWINGS

The present disclosure will be better understood from the following detailed description with reference to the drawings, which are not necessarily drawn to scale and in which.

DETAILED DESCRIPTION

Figure 1A:
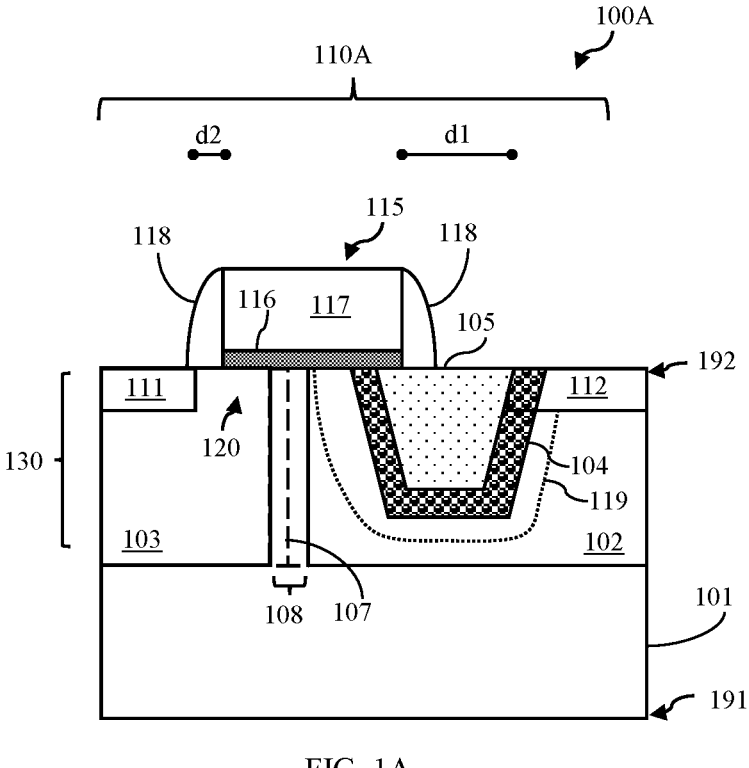
FIGS. 1A-1D are cross-section diagrams illustrating disclosed embodiments of a semiconductor structure, respectively.

As mentioned above, factors considered in modern IC design include, but are not limited to, performance improvement, size scaling, and power consumption. Oftentimes, however, there is a tradeoff between these factors. For example, LDMOSFETs are widely used in amplifiers, such as radio-frequency (RF) amplifiers, microwave power amplifiers, etc. because of their low on-resistance and because, in general, they have a relatively high blocking voltage (also referred to in the art as the drain-to-source breakdown voltage (BVdss)). However, with device size scaling and operation at higher voltages, LDMOSFETs can exhibit performance degradation including, but not limited to, reduced BVdss and reduced transconductance (Gm).

In view of the foregoing, disclosed herein are embodiments of a semiconductor structure. This semiconductor structure can include a semiconductor device with an active device region and, within the active device region, porous semiconductor material adjacent to an isolation structure. The porous semiconductor material can modify an electric field around the isolation structure and can thereby improve device performance. In some embodiments, the semiconductor device can be an LDMOSFET. The LDMOSFET can include an active device region, a well region within the active device region and, within the well region, an isolation structure (e.g., a shallow trench isolation (STI) structure), a porous region immediately adjacent to the isolation structure. The porous region can, for example, be adjacent to opposing sides and a bottom of the STI structure, adjacent to one side and the bottom (but not the opposite side) of the STI structure, adjacent to the opposing sides only (but not the bottom) of the STI structure, or adjacent to one side only (but not the opposite side or the bottom) of the STI structure. A drain drift region of the LDMOSFET can be within the well region bordering the STI structure (e.g., extending between a channel region and a drain region). The presence of the porous region adjacent to the STI structure can modify the electric field within the drain drift and, as a result, can improve both BVdss and Gm of the device. Also disclosed herein are method embodiments for forming the semiconductor structure.

FIGS. 1A-1D are cross-section diagrams illustrating disclosed embodiments of a semiconductor structure 100A-100D, respectively. Each of these semiconductor structures 100A-100D includes a semiconductor device 110A-110D with an active device region 130 and, within the active device region 130, porous semiconductor material (referred to herein as porous region 104) adjacent to an isolation structure. The porous semiconductor material can modify an electric field around the isolation structure 105 (e.g., an STI structure). and can thereby improve device performance.

More particularly, referring to FIGS. 1A-1D, disclosed herein are embodiments of a semiconductor structure 100A-100D.

The semiconductor structure 100A-100D can include a semiconductor layer 101 having a first surface 191 (i.e., a bottom surface) and a second surface 192 (i.e., a top surface) opposite the first surface 191. In some embodiments, the semiconductor layer 101 could be a bulk semiconductor substrate (e.g., a bulk silicon substrate or a bulk substrate of any other suitable semiconductor material, such as germanium, silicon germanium, etc.), as illustrated. However, it should be understood that the figures are not intended to be limiting. Alternatively, the semiconductor layer 101 could be the semiconductor layer (e.g., a silicon layer, a germanium layer, a silicon germanium layer, or a layer any other suitable semiconductor material) of a semiconductor-on-insulator structure (e.g., a silicon-on-insulator (SOI) structure) such that the first surface 191 is above and immediately adjacent to an insulator layer (not shown). Alternatively, the semiconductor layer 101 could be in either a bulk region or a semiconductor-on-insulator region (e.g., an SOI region) of a hybrid substrate (e.g., of a substrate, which is employed at an advanced SOI technology node, such as a fully-depleted SOI technology node, and which includes both bulk and SOI regions). The semiconductor layer 101 can, for example, be doped with a P-type dopant so as to have P-type conductivity at a relatively low conductivity level (e.g., so as to be a P-semiconductor layer). See the detailed discussion below regarding semiconductor material doping to achieve different conductivity types and levels.

The semiconductor structure 100A-100D can further include a semiconductor device 110A-110D having an active device region 130 in the semiconductor layer 101. Although not shown, boundaries of the active device region 130 could, for example, be defined by shallow trench isolation (STI) structures external to the device. That is, external STI structures could extend into the semiconductor layer 101 from the second surface 192 so as to laterally surround and thereby define the boundaries of the device.

The semiconductor device 110A-110D can be, for example, a LDMOSFET. In some embodiments, the LDMOSFET 110A-110D can be an N-channel LDMOSFT. Alternatively, the LDMOSFET 110A-110D could be a P-channel LDMOSFET.

The semiconductor device 110A-110D (e.g., LDMOSFET) can include, within the semiconductor layer 101, a first well region 102 and a second well region 103 positioned laterally adjacent to the first well region 102. In some embodiments, the first well region 102 and the second well region 103 can be physically separated by an additional region 108, as illustrated. Alternatively, the second well region 103 can abut the first well region 102 at a junction 107, as indicated by the dotted line. The first well region 102 and the second well region 103 can be doped regions (also referred to herein as dopant implant regions) within the semiconductor layer 101 and having different type conductivity. The conductivity type of the first and second well regions will vary depending upon whether the semiconductor device 110A-110D is an N-channel MOSFET or a P-channel MOSFET. Specifically, in the case of an N-channel MOSFET, the first well region 102 can be doped so as to have N-type conductivity and the second well region 103 can be doped so as to have P-type conductivity; whereas, in the case of a P-channel MOSFET, the first well region 102 can be doped so as to have P-type conductivity and the second well region 103 can be doped so as to have N-type conductivity.

It should be noted that, if the first and second well regions 102-103 are separated by an additional region 108, the additional region 108 can have the same type conductivity as the as the second well region 103 but at a lower conductivity level. For example, in the case of an N-channel LDMOSFET, the additional region 108 can be a P-region, which is continuous with the lower portion of the P-semiconductor layer 101. Also, for example, in the case of a P-channel LDMOSFET, the first well region 102 (i.e., a Pwell) and the second well region 103 (i.e., an Nwell) can both be within a deep N-well (not shown) so as to be isolated from the lower portion of the P-semiconductor layer 101 and, thus, the additional region 108 could be an N-region.

The semiconductor device 110A-110D (e.g., LDMOSFET) can further include, within the first well region 102 in the semiconductor layer 101, a porous region 104 (i.e., a region of porous semiconductor material). If the semiconductor layer 101 is a silicon layer, the porous region 104 can be a porous silicon (PS) region. If the semiconductor layer 101 is a silicon germanium layer, the porous region 104 can be a porous silicon germanium region, and so on. For purposes of this disclosure, a porous region or a region of porous semiconductor material refers specifically to a region that includes nanopores within its microstructure. As discussed in greater detail below with regard to the method embodiments such nanopores can be introduced into a localized region of a semiconductor material through an electrochemical process. In any case, the porous region 104 can be contained within the first well region 102 extending, for example, from the second surface 192 of the semiconductor layer 101 to some depth above the bottom of the first well region 102 (i.e., the first well region 102 can extend deeper into the semiconductor layer 101 than the porous region 104, as illustrated).

The semiconductor device 110A-110D (e.g., LDMOSFET) can further include, within the first well region 102 in the semiconductor layer 101, an isolation structure 105 and, particularly, an internal STI structure. This STI structure 105 can include a trench that extends into the first well region 102 from the second surface 192 of the semiconductor layer 101. This STI structure 105 can further include one or more layers of isolation material (e.g., silicon dioxide, silicon nitride, etc.) filling the trench. This STI structure 105 can have opposing sides and a bottom and can be positioned within the first well region 102 so that portions of the first well region 102 surround the opposing sides and the bottom. Furthermore, the STI structure 105 and the porous region 104 (which as mentioned above is also within the first well region 102) can be positioned so that the porous region 104 is immediately adjacent to at least one of the opposing sides the STI structure 105.

The relative positioning of the STI structure 105 and the porous region 104 within the first well region 102 can vary within the different semiconductor structure embodiments.

For example, referring specifically to the semiconductor device 110A (e.g., LDMOSFET) in the semiconductor structure 100A of FIG. 1A, the porous region 104 can extend deeper into the first well region 102 (as measured from the second surface 192) than the STI structure 105 and can also be positioned immediately adjacent to the opposing sides and the bottom surface of the STI structure 105. That is, the STI structure 105 can extend into the porous region 104 without going completely through it and can be narrower in width than the porous region 104. Thus, the STI structure 105 in the semiconductor device 110A is bordered by the porous region 104 at the bottom surface and at the opposing sides.

Figure 1B:
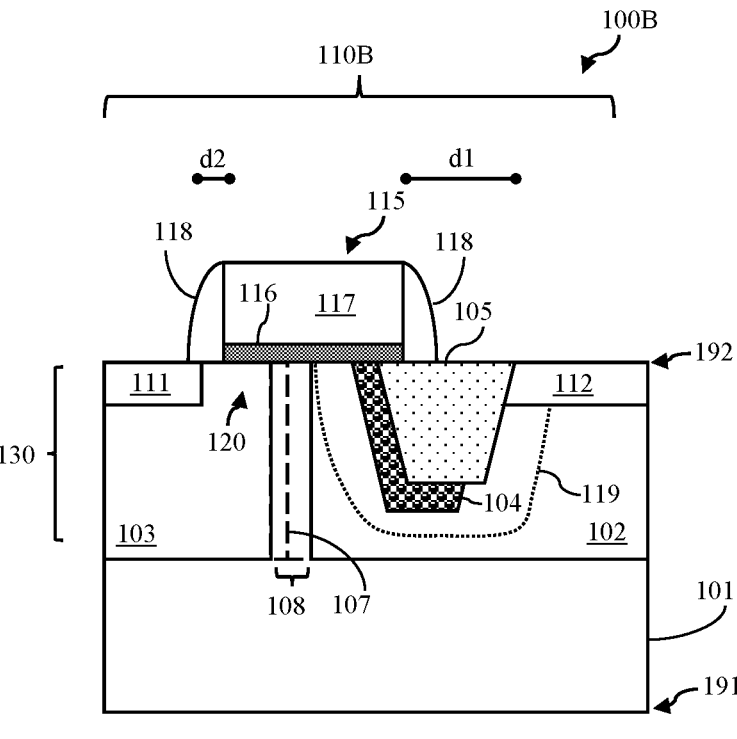

Alternatively, referring specifically to the semiconductor device 110B (e.g., LDMOSFET) in the semiconductor structure 100B of FIG. 1B, the porous region 104 can extend deeper into the first well region 102 (as measured from the second surface 192) than the STI structure 105 and can be positioned immediately adjacent to one of the opposing sides and the bottom surface only of the STI structure 105. That is, the STI structure 105 can extend into one side of the porous region 104, without going completely through it. Thus, the STI structure 105 in the semiconductor device 110B is bordered by the porous region 104 on one side and at least along a portion of the bottom surface.

Figure 1C:
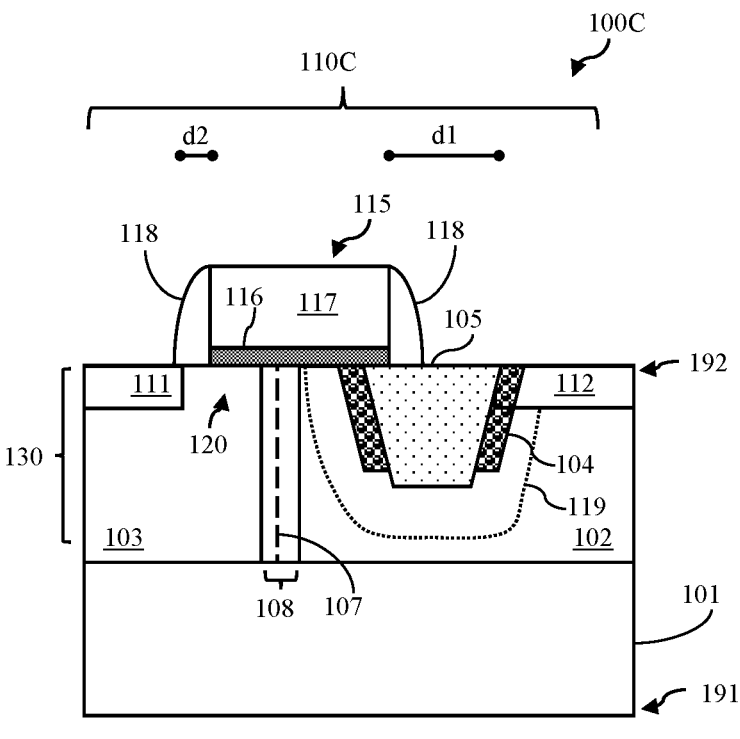

Alternatively, referring specifically to the semiconductor device 110C (e.g., LDMOSFET) in the semiconductor structure 100C of FIG. 1C, the porous region 104 can extend shallower into the first well region 102 (as measured from the second surface 192) than the STI structure 105 and can be positioned immediately adjacent to the opposing sides only of the STI structure 105. That is, the STI structure 105 can extend into and completely through the porous region 104 and it can be narrower in width than the porous region 104. Thus, the STI structure 105 of the semiconductor device 110C is bordered by the porous region 104 on the opposing sides only.

Figure 1D:
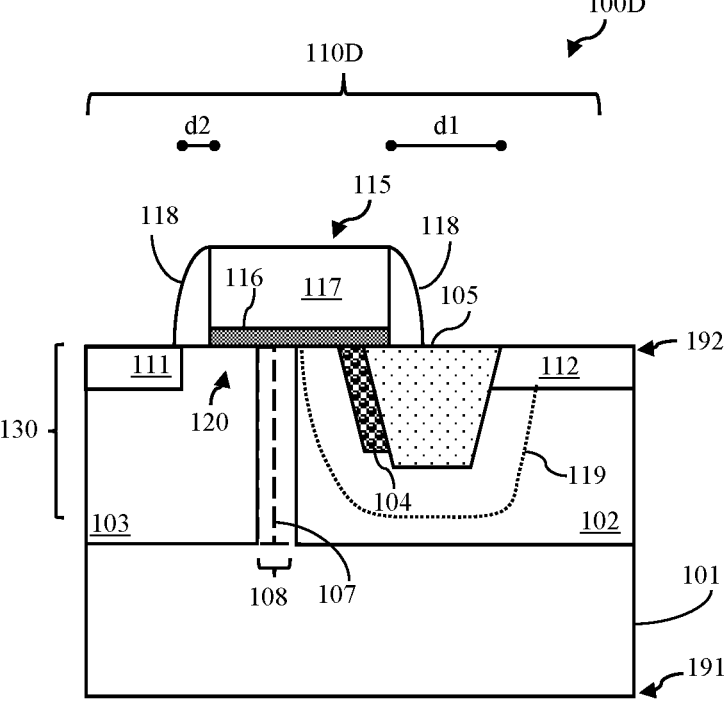

Alternatively, referring specifically to the semiconductor device 110D (e.g., LDMOSFET) in the semiconductor structure 100D of FIG. 1D, the porous region 104 can extend shallower into the first well region 102 (as measured from the second surface 192) than the STI structure 105 and it can be positioned immediately adjacent to one of the opposing sides only of the STI structure 105. That is, the STI structure 105 can extend into and completely through one side of the porous region 104. Thus, the STI structure 105 of the semiconductor device 110D is bordered by the porous region 104 on only one side.

The semiconductor device 110A-110D (e.g., LDMOSFET) can further include a drain region 112 and a source region 111. The drain region 112 and the source region 111 can have the same type conductivity as the first well region 102, but at a higher conductivity level. Thus, for example, in the case of an N-channel LDMOSFET, the drain region 112 and the source region 111 can be N+ drain and source regions; whereas, in the case of a P-channel LDMOSFET, the drain region 112 and the source region 111 can be P+ source and drain regions. The drain region 112 can be immediately adjacent to the first well region 102 distal to the additional region 108 (or junction 107) such that the porous region 104 and the STI structure 105 are between the second well region 103 and the drain region 112. The source region 111 can be immediately adjacent to the second well region 103 distal to the additional region 108 (or junction 107). Various different source/drain configurations for LDMOS-FETs are well known in the art and, thus, the detail thereof have been omitted from this specification in order to allow the reader to focus on the salient aspects of the disclosed embodiments. However, it should be understood that the source/drain regions could have any suitable source/drain region configuration. For example, they could be dopant implant regions, in situ doped epitaxial semiconductor material-filled or over-filled trenches, doped implant regions with raised source/drain regions (i.e., in situ doped epitaxial semiconductor layers) thereon, etc.

The semiconductor device 110A-110D (e.g., LDMOS-FET) can further include a gate 115 on the second surface 192 of the semiconductor layer 101 between the drain region 112 and the source region 111. The gate 115 can be separated from the drain region 112 by a first distance (d1) and separated from the source region 111 by a second distance (d2) that is less than the d1. The gate 115 can be located on the portion of the second well region 103 between the source region 111 and the additional region 108 (or junction 107), can traverse the additional region 108 (or junction 107), and can further extend laterally over portions of the first well region 102 and the porous region 104 therein to or onto the STI structure 105. The gate 115 can include a gate dielectric layer 116 (including one or more layers of gate dielectric material) and a gate conductor layer 117 (including one or more layers of gate conductor material) on the gate dielectric layer 116. Various different gate configurations for LDMOS-FETs are well known in the art, and thus the details thereof have been omitted from this specification to allow the reader to focus on the salient aspects of the disclosed embodiments. However, it should be understood that the gate could have any suitable LDMOSFET configuration. For example, gate could be a gate first polysilicon gate, a gate first metal gate, a replacement metal gate, etc. Additionally, the semiconductor device 110A-110D (e.g., LDMOSFET) can further include gate sidewall spacers 118 (e.g., dielectric gate sidewalls spacers) positioned laterally adjacent to opposing sidewalls of the gate structure in order to electrically isolate the gate 115 from the adjacent source/drain regions.

The semiconductor device 110A-110D can further include a channel region 120. The channel region 120 can be within the second well region 103 below the gate 115 and positioned laterally between the source region 111 and the drain region 112 and, more particularly, positioned laterally between the source region 111 and the junction 107 (or additional region 108). Additionally, although not shown (e.g., in order to avoid clutter in the drawings), additional features of the semiconductor structure 100A-100D can include, but are not limited to, well contact region(s) (e.g., a well contact region, such as a dopant implant region, on the second well region 103 and having the same type conductivity), one or more layers of interlayer dielectric (ILD) material over the device, and middle of the line (MOL) contacts extending through the ILD material to the source region 111, drain region 112, gate 115 and well contact region(s).

With the above-described configuration, the semiconductor device 110A-110D (e.g., LDMOSFET) includes a drain drift region 119 and, particularly, a current path in the first well region 102 between the gate 115 and the drain region 112 and bordering and, particularly, extending down and around the STI structure 105 including through the porous region 104. The presence of the porous region 104 within the conductive path in the drain drift region effectively modifies the electric field and, as a result, improves both BVdss and Gm of the device.

Also disclosed herein are method embodiments for forming the various semiconductor structure embodiments described above and illustrated in FIGS. 1A-1D.

Figure 2:
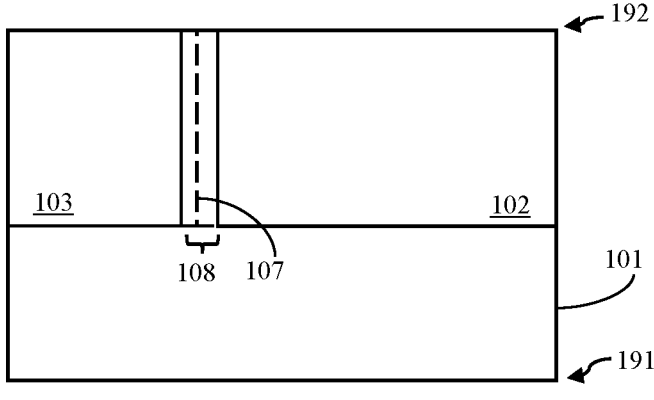
FIG. 2 is a cross-section diagram illustrating a partially completed semiconductor structure formed according to disclosed method embodiments.

The method can include providing a semiconductor layer 101 having a first surface 191 (i.e., a bottom surface) and a second surface 192 (i.e., a top surface) opposite the first surface 191 (see FIG. 2). As discussed above with regard to the structure embodiments, the semiconductor layer 101 could be a bulk semiconductor substrate (e.g., a bulk silicon substrate or a bulk substrate of any other suitable semiconductor material, such as germanium, silicon germanium, etc.), as illustrated. Alternatively, the semiconductor layer 101 could be the semiconductor layer of a semiconductor-on-insulator structure. Alternatively, the semiconductor layer 101 could be in either a bulk region or a semiconductor-on-insulator region of a hybrid substrate. In any case, the semiconductor layer 101 can be doped with a P-type dopant so as to have P-type conductivity at a relatively low conductivity level (e.g., so as to be a P-semiconductor layer).

The method can further include forming, within the semiconductor layer 101, a first well region 102 and a second well region 103 positioned laterally adjacent to the first well region 102 (e.g., see FIG. 2). The well regions can, for example, be formed by performing discrete dopant implantation processes. That is, a first mask could be formed on the second surface 192 of the semiconductor layer 101 and lithographically patterned and etched so as to have an opening that exposes a first area of the semiconductor layer. A dopant can be implanted through the opening to form the first well region with a desired conductivity type at a desired conductivity level. The first mask can then be removed. Similarly, a second mask could be formed on the second surface 192 of the semiconductor layer 101 and lithographically patterned and etched so as to have an opening that exposes a second area of the semiconductor layer. A different dopant can be implanted through the opening to form the second well region with a desired conductivity type (which is different from that of the first well region) at a desired conductivity level. The second mask can then be removed. Such dopant implantation processes are well known in the art and, thus, the details thereof have been omitted from this specification in order to allow the reader to focus on the salient aspects of the disclosed embodiments. In any case, these two masked dopant implantation processes can be performed so that either the first well region 102 and the second well region 103 are physically separated by an additional region 108, as illustrated, or so that the second well region 103 abuts the first well region 102 at a junction 107, as indicated by the dotted line. It should be noted that the conductivity type of the first and second well regions will vary depending upon whether the semiconductor device 110A-110D is an N-channel MOSFET or a P-channel MOSFET. Specifically, in the case of an N-channel MOSFET, doping should be performed so that the first well region 102 has N-type conductivity and the second well region 103 has P-type conductivity; whereas, in the case of a P-channel MOSFET, doping should be performed so that the first well region 102 has P-type conductivity and the second well region 103 has N-type conductivity.

Optionally, in the case of a P-channel LDMOSFET, before forming the first and second well regions, a deep Nwell could be formed (not shown, using a similar masked dopant implantation process) and the first well region 102 (i.e., a Pwell) and the second well region 103 (i.e., an Nwell) could both be formed within the deep Nwell.

Figure 3:
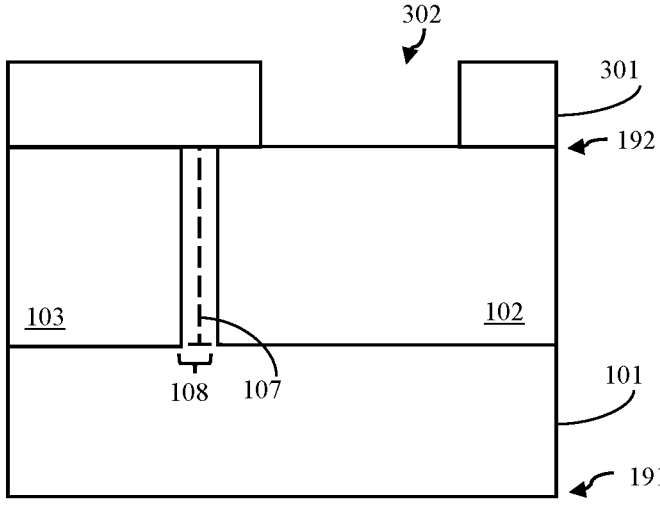
FIG. 3 is a cross-section diagram illustrating a partially completed semiconductor structure formed according to the disclosed method embodiments.
Figure 4:
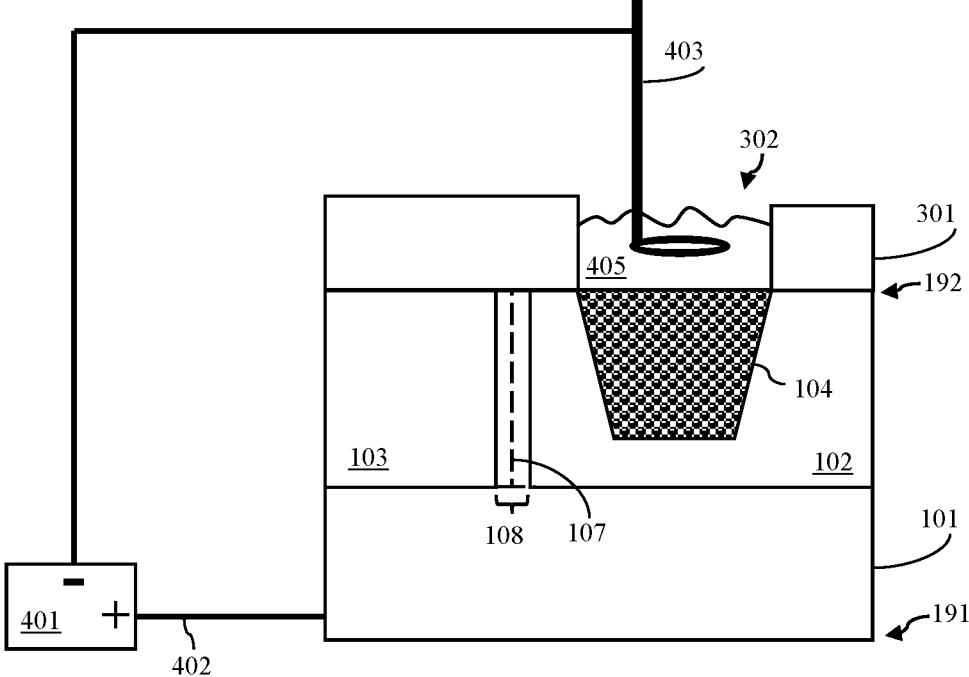
FIG. 4 is a cross-section diagram illustrating a partially completed semiconductor structure formed using an electrochemical processing technique according to the disclosed method embodiments.

The method can further include forming, within the first well region 102 in the semiconductor layer 101, a porous region 104 (i.e., a region of porous semiconductor material) (see FIGS. 3 and 4). For example, yet another mask 301 could be formed on the second surface 192 of the semiconductor layer 101. This mask 301 could be lithographically patterned and etched to include an opening 302, which exposes a section of the second surface 192 above the first well region 102 and in a desired area for the porous region (see FIG. 3). Electrochemical processing can then be performed to form the porous region in the first well region of the semiconductor below the exposed surface. That is, this electrochemical processing converts the semiconductor material in the region of the semiconductor layer below the exposed surface to a porous semiconductor material by causing the formation of nanopores to be introduced into the region.

In one exemplary technique for forming the porous region (e.g., a silicon porous region in the silicon layer) an etchant 405 (i.e., an etching solution, such as a hydrofluoric acid (HF) electrolyte solution) be placed within the opening 302 (see FIG. 4). A power source 401 can have a negative electrode 403 connected to the etchant 405 to supply electrons to the etchant 405 (i.e., the cathode) and a positive electrode 402 connected to the semiconductor layer 101 to remove electrons from the etchant 405 (i.e., the anode). Electrochemical reactions occur at both the cathode and the anode. At the anode, the silicon is oxidized, creating the nanopores therein.

In any case, the process of forming the porous region 104 should be performed so that the porous region 104 extends, within the first well region 102, to some depth above the bottom of the first well region 102 (i.e., so the first well region 102 extends deeper into the semiconductor layer 101 than the porous region 104, as illustrated).

Figures 5A, 5B, 5C, 5D:
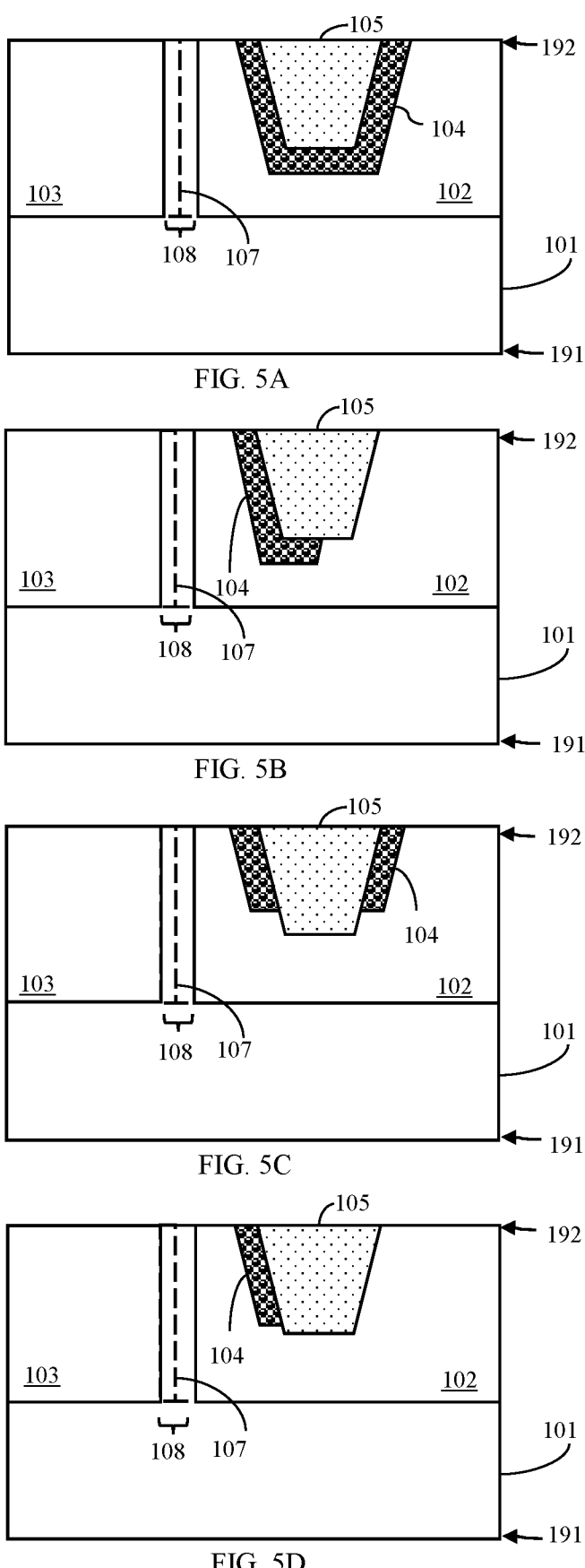
FIGS. 5A-5D are cross-section diagrams illustrating alternative partially completed semiconductor structures, respectively, formed according to the disclosed method embodiments.

The method can further include forming, within the first well region 102 in the semiconductor layer 101, an isolation structure 105 and, particularly, an internal STI structure (see any of FIGS. 5A-5D). The STI structure 105 can, for example, be formed using convention STI formation techniques. That is, a trench can be formed (e.g., lithographically patterned and etched) into the first well region 102. The trench for the STI structure should specifically be formed so that the porous region 104 (which as mentioned above is also within the first well region 102) will be immediately adjacent to at least one of the opposing sides the STI structure 105. For example, as shown in FIG. 5A, the trench can be formed so it extends into, without going completely through, the porous region 104 and so it is narrower in width than the porous region 104. Thus, the trench is bordered by the porous region 104 at the bottom surface and on the opposing sides. Alternatively, as illustrated in FIG. 5B, the trench can be formed so that it extends into one side of the porous region 104, without going completely through. Thus, the trench is bordered by the porous region 104 along at least a portion of the bottom surface and on one side. Alternatively, as illustrated in FIG. 5C, the trench can be formed so that it extends into and completely through the porous region 104 and so that it is narrower in width than the porous region 104. Thus, the trench is bordered by the porous region 104 on the opposing sides only.

Alternatively, as shown in FIG. 5D, the trench can be formed so that it extends into one side of and completely through the porous region 104. Thus, the trench can be bordered by the porous region 104 on only one side. Following trench formation, one or more layers of isolation material (e.g., silicon dioxide, silicon nitride, etc.) can be deposited so as to fill the trench. Then, a chemical mechanical polishing (CMP) process can be performed to remove any isolation material from the second surface 192 (again see FIGS. 5A-5D).

Figure 6:
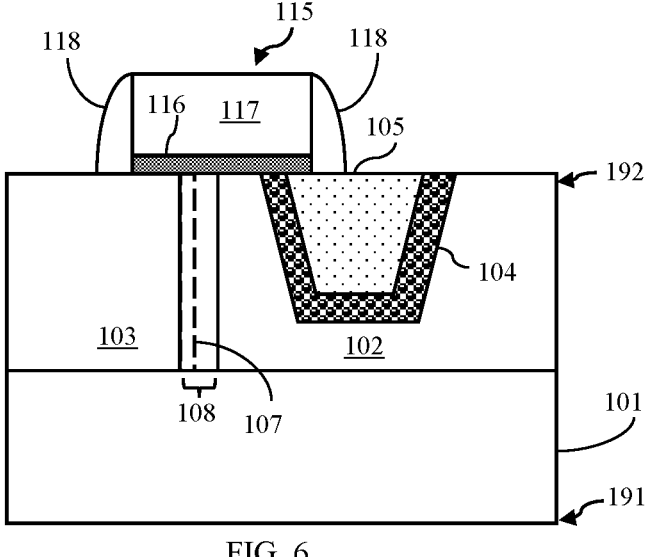
FIG. 6 is a cross-section diagram illustrating a partially completed semiconductor structure formed according to disclosed method embodiments.

The method can further include forming a gate 115 (including a gate dielectric layer 116 and a gate conductor layer 117 thereon) on the second surface 192 of the semiconductor layer 101 and gate sidewall spacers 118 positioned laterally adjacent to the gate 115 (see FIG. 6). Techniques for forming a gate 115 with gate sidewall spacers 118 include, for example, gate first polysilicon gate formation, gate first metal gate formation, replacement metal gate formation, etc. Such techniques are well known in the art and, thus, the details thereof have been omitted from the specification in order to allow the reader to focus on the salient aspects of the disclosed embodiments. In any case, the gate 115 should be formed so that it is aligned above the additional region 108 (or junction 107), so that it extends laterally in one direction over portions of the first well region 102 and porous region 104 to or onto the STI structure 105, and so it extends laterally in the opposite direction onto a portion of the second well region 103.

Figure 7:
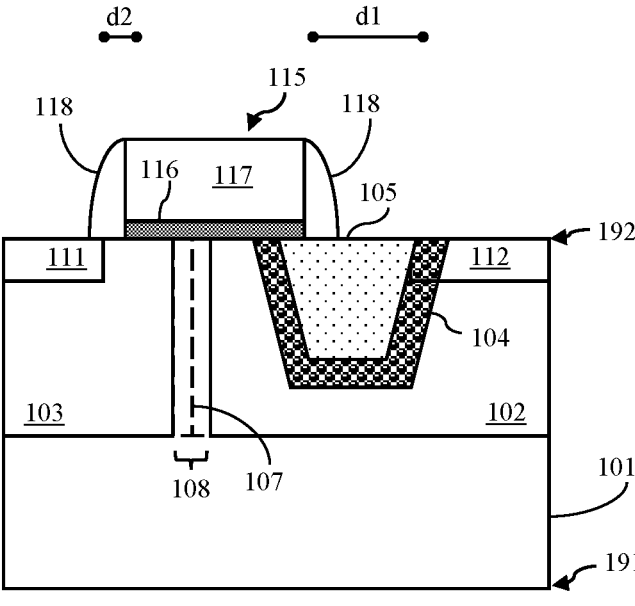
FIG. 7 is a cross-section diagram illustrating a semiconductor structure formed according to the disclosed method embodiments.

Following gate formation, a drain region 112 and a source region 111 for the semiconductor device 110A-110D (e.g., LDMOSFET) could be formed (see FIG. 7). Various different source/drain formation techniques for MOSFETs and, more particularly, for LDMOSFETs are well known in the art (e.g., by dopant implantation and/or in situ doped epitaxial deposition). Thus, these techniques have been omitted form the specification in order to allow the reader to focus on the salient aspects of the disclosed embodiments. In any case, the drain region 112 and the source region 111 can be concurrently formed so that they have the same type conductivity as the first well region 102, but at a higher conductivity level. Additionally, due to prior placement of the STI structure 105 following formation of the source/drain regions, the gate 115 can be separated from the drain region 112 by a first distance (d1) and separated from the source region 111 by a second distance (d2) that is less than the d1.

Although not shown (e.g., in order to avoid clutter in the drawings), additional processing can include, but is not limited to, the formation of well contact region(s) (e.g., a well contact region, such as a dopant implant region, on the second well region 103 and having the same type conductivity), the formation of one or more layers of interlayer dielectric (ILD) material over the device, and the formation of MOL contacts extending through the ILD material to the source region 111, drain region 112, gate 115 and well contact region(s).

It should be noted that in the structures and methods described above a semiconductor material refers to a material whose conducting properties can be altered by doping with an impurity. Such semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Additionally, the method embodiments described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Additionally, in the structure and method embodiments described above, the terminology used is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various disclosed embodiments have been presented for purposes of illustration but are not intended to be exhaustive or limiting. Many modifications and variations will be apparent to those of ordinary skill in the art without departing from the scope and spirit of the disclosed embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor layer; and
a device including:
a first well region in the semiconductor layer;
a porous region of the semiconductor layer within the first well region; and
an isolation structure in the first well region,
wherein the isolation structure includes: a trench extending into the first well region; and isolation material within the trench,
wherein the isolation material is non-conductive, and
wherein at least one side of the trench of the isolation structure extends into the porous region such that the porous region is at least positioned laterally immediately adjacent to the isolation material of the isolation structure.

2. The structure of claim 1, wherein the porous region any one of:
extends deeper into the first well region than the isolation structure and is positioned immediately adjacent to opposing sides and a bottom surface of the isolation structure;
extends deeper into the first well region than the isolation structure and is positioned immediately adjacent to one of the opposing sides and the bottom surface of the isolation structure;

extends shallower into the first well region than the isolation structure and is positioned immediately adjacent to the opposing sides of the isolation structure; and
extends shallower into the first well region than the isolation structure and is positioned immediately adjacent to one of the opposing sides.

3. The structure of claim 1, wherein the first well region extends deeper into the semiconductor layer than the porous region.

4. The structure of claim 1, wherein the device further includes:
a gate on the semiconductor layer adjacent to the first well region and extending laterally toward the isolation structure over a portion of the porous region;
a drain region immediately adjacent to the first well region and separated from the gate by the isolation structure; and
a drain drift region in the first well region bordering the isolation structure between the drain region and the gate.

5. The structure of claim 4, wherein the device further includes a second well region in the semiconductor layer positioned laterally adjacent to the first well region, and wherein the gate is further on the semiconductor layer adjacent to the second well region.

6. The structure of claim 5, wherein the second well region abuts the first well region and wherein the gate traverses a junction between the first well region and the second well region.

7. The structure of claim 5, wherein the second well region is physically separated from the first well region by an additional region of the semiconductor layer and wherein the gate traverses the additional region.

8. The structure of claim 5, wherein the device further includes a source region immediately adjacent to the second well region, wherein the gate is between the drain region and the source region, and wherein the gate is separated from the drain region by a first distance and from the source region by a second distance that is less than the first distance.

9. The structure of claim 8,
wherein the first well region, the drain region, and the source region have a same type conductivity,
wherein the second well region has a different type conductivity than the first well region, the drain region, and the source region, and
wherein the drain region and the source region have a higher conductivity level than the first well region.

10. The structure of claim 1, wherein the semiconductor layer includes a silicon layer, and the porous region is a porous silicon region.

11. A structure comprising:
a semiconductor layer; and
a device including:
a first well region in the semiconductor layer;
a porous region of the semiconductor layer within the first well region;
an isolation structure in the first well region, wherein the isolation structure includes: a trench extending into the first well region; and isolation material within the trench, wherein the isolation material is non-conductive, and wherein at least one side of the trench of the isolation structure extends into the porous region such that the porous region is at least positioned laterally immediately adjacent to the isolation material of the isolation structure;
a drain region immediately adjacent to the first well region;

a second well region in the semiconductor layer positioned laterally adjacent to the first well region, wherein the porous region and the isolation structure are within the first well region between the second well region and the drain region;

a source region immediately adjacent to the second well region;

a gate on the semiconductor layer between the drain region and the source region, wherein the gate is separated from the drain region by a first distance and from the source region by a second distance that is less than the first distance; and a drain drift region in the first well region bordering the isolation structure between the drain region and the gate.

12. A method comprising:

providing a semiconductor layer; and forming a device including:

a first well region in the semiconductor layer;

a porous region in the semiconductor layer within the first well region; and an isolation structure in the first well region, wherein the isolation structure includes: a trench extending into the first well region; and isolation material within the trench, wherein the isolation material is non-conductive, and wherein at least one side of the trench of the isolation structure extends into the porous region such that the porous region is at least positioned laterally immediately adjacent to the isolation material of the isolation structure.

13. The method of claim 12, wherein the forming of the device includes:

forming the first well region in the semiconductor layer;

forming the porous region in the first well region; and forming the isolation structure in the first well region adjacent to the porous region, wherein the porous region and the isolation structure are formed so that the porous region any of:

extends deeper into the first well region than the isolation structure and is positioned immediately adjacent to opposing sides and a bottom surface of the isolation structure;

extends deeper into the first well region than the isolation structure and is positioned immediately adjacent to one of the opposing sides and the bottom surface of the isolation structure;

extends shallower into the first well region than the isolation structure and is positioned immediately adjacent to the opposing sides of the isolation structure; and extends shallower into the first well region than the isolation structure and is positioned immediately adjacent to one of the opposing sides.

14. The method of claim 13, wherein the first well region and the porous region are formed so that the first well region extends deeper into the semiconductor layer than the porous region.

15. The method of claim 13, wherein the forming of the porous region includes performing an electrochemical etch process.

16. The method of claim 13, wherein the forming of the device further includes:

forming a second well region in the semiconductor layer positioned laterally adjacent to the first well region; and forming a gate on the semiconductor layer, wherein the gate extends laterally from the isolation structure over portions of the porous region, the first well region, and the second well region.

17. The method of claim 16, wherein the first well region and the second well region are formed so the second well region abuts the first well region and wherein the gate is formed traversing a junction between the first well region and the second well region.

18. The method of claim 16, wherein the first well region and the second well region are formed so the second well region is physically separated from the first well region by an additional region of the semiconductor layer and wherein the gate is formed traversing the additional region.

19. The method of claim 16, wherein the forming of the device further includes forming a drain region and a source region so the drain region is immediately adjacent to the first well region, the source region is immediately adjacent to the second well region, and so the gate is between the drain region and the source region, separated from the drain region by a first distance, and separated from the source region by a second distance that is less than the first distance.

20. The method of claim 12, wherein the semiconductor layer includes a silicon layer, and the porous region is a porous silicon region.

* * * * *